US012336439B2

(12) United States Patent
Noguchi et al.

(10) Patent No.: US 12,336,439 B2
(45) Date of Patent: Jun. 17, 2025

(54) QUANTUM GATE DEVICE

(71) Applicant: JAPAN SCIENCE AND TECHNOLOGY AGENCY, Kawaguchi (JP)

(72) Inventors: Atsushi Noguchi, Koganei (JP); Alto Osada, Yokohama (JP); Yasunobu Nakamura, Tsukuba (JP)

(73) Assignee: JAPAN SCIENCE AND TECHNOLOGY AGENCY, Kawaguchi (JP)

( * ) Notice: Subject to any disclaimer, the term of this patent is extended or adjusted under 35 U.S.C. 154(b) by 457 days.

(21) Appl. No.: 17/926,073

(22) PCT Filed: Apr. 8, 2021

(86) PCT No.: PCT/JP2021/014961
§ 371 (c)(1),
(2) Date: Nov. 17, 2022

(87) PCT Pub. No.: WO2021/235132
PCT Pub. Date: Nov. 25, 2021

(65) Prior Publication Data
US 2023/0189666 A1 Jun. 15, 2023

(30) Foreign Application Priority Data

May 19, 2020 (JP) .................................. 2020-087283

(51) Int. Cl.
*G06N 10/20* (2022.01)
*H10N 69/00* (2023.01)

(52) U.S. Cl.
CPC ............. *H10N 69/00* (2023.02); *G06N 10/20* (2022.01)

(58) Field of Classification Search
CPC ........ H10N 69/00; H10N 60/12; G06N 10/20; G06N 10/00; H03K 17/92; H03K 19/195
See application file for complete search history.

(56) References Cited

U.S. PATENT DOCUMENTS

2004/0077503 A1* 4/2004 Blais ..................... G06N 10/40
505/193

OTHER PUBLICATIONS

Noguchi et al., "Single-photon quantum regime of artificial radiation pressure on a surface acoustic wave resonator," Aug. 8, 2018, <URL: https://arxiv.org/pdf/1808.03372.pdf>.

(Continued)

*Primary Examiner* — Tucker J Wright
(74) *Attorney, Agent, or Firm* — Oliff PLC

(57) ABSTRACT

A quantum gate device includes a first superconducting circuit which includes at least one of Josephson devices in an annular circuit including a superconducting wire and resonates at a first resonance frequency, a second superconducting circuit which includes at least one of Josephson devices in an annular circuit including a superconducting wire and resonates at a second resonance frequency, a connection unit which includes a capacitor and a superconducting wire provided at each electrode of the capacitor and connects the first and second circuits, a magnetic field application means applying a magnetic field to one or both of the first and second circuits, a quantum gate control electromagnetic wave irradiation unit irradiating one of the first and second circuits with a control electromagnetic wave, and an unnecessary transition suppression electromagnetic wave irradiation unit irradiating one of the first and second circuits with an unnecessary interaction suppression electromagnetic wave.

8 Claims, 6 Drawing Sheets

(56) References Cited

OTHER PUBLICATIONS

Noguchi, Atsushi, "Quantum gate with a radiation pressure interaction between superconducting qubits," Center for Emergent Matter Science, Institute of Physical and Chemical Research, Apr. 23, 2019, <URL: https://www.cems.riken.jp/sq20th/SQ20th_booklet_190423_online.pdf>.

Mundada et al., "Suppression of Qubit Crosstalk in a Tunable Coupling Superconducting Circuit," Physical Review Applied, 2019, vol. 12, pp. 054023-1-054023-10.

Ware et al., "Cross-resonance interactions between superconducting qubits with variable detuning," May 27, 2019, <URL: https://arxiv.org/pdf/1905.11480.pdf>.

Jun. 29, 2021 Written Opinion of the International Searching Authority issued in International Patent Application No. PCT/JP2021/014961.

* cited by examiner

*FIRST CAPACITOR 114 AND SECOND CAPACITOR 214 ARE NOT ILLUSTRATED

QUANTUM GATE DEVICE

TECHNICAL FIELD

The present invention relates to a quantum gate device which is a constituent element of a quantum computer.

BACKGROUND ART

Quantum computers are actively researched and developed in recent years. In a conventional computer, calculation is performed using data represented by either one of binary values (generally "0" and "1") as a minimum unit. On the other hand, in a quantum computer, calculation is performed on a superposition state occurring in quantum mechanics, so that calculation capability is expected to be enhanced. When measurement (observation) is performed on the superposition state after calculation, one of discrete eigenstates is obtained as a calculation result. In another expression used in quantum mechanics, calculation is performed in a wave state, and a calculation result is obtained in a particle state.

In a conventional computer, an operation called a logic gate is performed, in which data is input, a logical operation such as logical conjunction (AND), logical disjunction (OR), or negation (NOT) is performed, and the result of the logical operation is output. Similarly, in a quantum computer, an operation called a quantum gate is performed, in which data is input and a predetermined logical operation is performed. A device that performs such an operation is referred to as a quantum gate device.

Non Patent Literature 1 describes a partial superconducting circuit serving as a constituent element of a quantum gate device. The partial superconducting circuit described in Non Patent Literature 1 includes, similarly to a first superconducting circuit (referred to as "first superconducting circuit 91") illustrated in FIG. 7 of the present application, one first Josephson device 911 and a second Josephson device group 912 in which n (n is an integer of two or more, and FIG. 7 illustrates an example in which n=2) second Josephson devices 9121, 9122, . . . are connected in series by a superconducting wire, which is a wire made from a superconductor, are annularly connected by a superconducting wire. The first superconducting circuit 91 illustrated in FIG. 7 of the present application is configured by annularly connecting a partial superconducting circuit 913 and a capacitor (referred to as "first capacitor" in the present description) 914 by a superconducting wire. In each of the first Josephson device 911 and the second Josephson devices 9121, 9122, . . . , a thin film made from an insulator is sandwiched between two superconductors. As each of the second Josephson devices 9121, 9122, . . . , a device having Josephson energy higher than n times (here, n is the same as the number n of the second Josephson devices 9121, 9122 . . . ) the first Josephson device 911 is used. The first superconducting circuit 91 is a circuit equivalent to an LC resonance circuit including a coil and a capacitor. A resonance frequency of the first superconducting circuit 91 is set to $\omega_1$.

Non Patent Literature 2 describes, as illustrated in FIG. 7 of the present application, that a quantum gate device 90 is configured by combining a superconducting circuit (first superconducting circuit 91) and another superconducting circuit (second superconducting circuit 92 in FIG. 7) generally called transmon. The second superconducting circuit 92 is formed by annularly connecting a Josephson device 921 and a capacitor (referred to as "second capacitor" in the present description) 924 by a superconducting wire. The second superconducting circuit 92 is also a circuit equivalent to an LC resonance circuit. A resonance frequency of the second superconducting circuit 92 is set to $\omega_2$.

The quantum gate device 90 includes a circuit in which the first superconducting circuit 91 and the second superconducting circuit 92 are connected by a superconducting wire provided with a capacitor (referred to as a "connection capacitor" in the present description) 934. The quantum gate device 90 further includes a magnetic field application unit 94 which applies a static magnetic field to the partial superconducting circuit 913, a first quantum gate control electromagnetic wave irradiation unit 95 which irradiates the first superconducting circuit 91 with an electromagnetic wave of a first predetermined frequency, and a second quantum gate control electromagnetic wave irradiation unit 96 which irradiates the second superconducting circuit 92 with an electromagnetic wave of a second predetermined frequency. Hereinafter, an electromagnetic wave emitted by the first quantum gate control electromagnetic wave irradiation unit 95 and the second quantum gate control electromagnetic wave irradiation unit 96 is referred to as "control electromagnetic wave". The first quantum gate control electromagnetic wave irradiation unit 95 includes a radio-frequency power supply 951 and an electromagnetic wave irradiation electrode 9521 provided to face the first superconducting circuit 91 and to which radio-frequency voltage is applied between the electromagnetic wave irradiation electrode 9521 and the ground. The second quantum gate control electromagnetic wave irradiation unit 96 includes a radio-frequency power supply 961 and an electromagnetic wave irradiation electrode 9621 similar to the first quantum gate control electromagnetic wave irradiation unit 95. The electromagnetic wave irradiation electrode 9521 (9621) is represented as one electrode of a capacitor 952 (962) connected to the first superconducting circuit 91 (second superconducting circuit 92) in the equivalent circuit illustrated in FIG. 7. While application of a magnetic field by the magnetic field application unit 94 is always performed during operation of the quantum gate device 90, irradiation of a control electromagnetic wave from the first quantum gate control electromagnetic wave irradiation unit 95 and the second quantum gate control electromagnetic wave irradiation unit 96 is performed at a predetermined timing as described later. Further, the quantum gate device 90 includes a first measurement unit 971 which measures an energy state and a phase (described later) of the first superconducting circuit 91 and a second measurement unit 972 which measures an energy state and a phase of the second superconducting circuit 92. The first measurement unit 971 and the second measurement unit 972 are collectively referred to as "measurement unit 97".

The first superconducting circuit 91 functions as a quantum bit having one-bit information represented by using two states of a ground state (referred to as "g1") and a first excited state (e1). The second superconducting circuit 92 functions as a quantum bit having one-bit information represented by using two states of a ground state (g2) and a first excited state (e2). In the quantum gate device 90 as a whole, there are four energy states "g1g2", "e1g2", "g1e2", and "e1e2" formed by interaction of these two quantum bits. An energy difference between "g1g2" and "e1g2" is $(h/2\pi)\omega_1$, an energy difference between "g1g2" and "g1e2" is $(h/2\pi)\omega_2$, and an energy difference between "g1g2" and "e1e2" is $(h/2\pi)\times(\omega_1+\omega_2)$ (h is the Planck constant). FIG. 8 illustrates each energy state in a case where $\omega_1 < \omega_2$.

The phase refers to a phase φ used when a quantum bit in a superposed state of two states |g⟩ (g1 of the first superconducting circuit 91 or g2 of the second superconducting circuit 92 in the quantum gate device 90) and |e> (e1 of the first superconducting circuit 91 or e2 of the second superconducting circuit 92) is represented as a wave of A|g>+(cos φ+i sin φ)B|e>. Here, A and B are both real numbers, and satisfy a condition of $A^2+B^2=1$. At this time, the probability that |g> is observed is $A^2$, and a probability that |e> is observed is $B^2$, and neither of them depends on the phase φ.

Quantum gates that can be operated by the quantum gate device 90 includes a quantum gate called an iSwap gate. In the iSwap gate, first, the first quantum gate control electromagnetic wave irradiation unit 95 irradiates the first superconducting circuit 91 with a control electromagnetic wave having the frequency $\omega_1$ or $\omega_2$ to set the energy state to either "g1e2" or "e1g2". This state is referred to as an initial state. Next, when the first quantum gate control electromagnetic wave irradiation unit 95 irradiates the first superconducting circuit 91 with a control electromagnetic wave having a difference frequency $|\omega_2-\omega_1|$ corresponding to the energy difference $\Delta_{SW}=(h/2\pi)|\omega_2-\omega_1|$ between "g1e2" and "e1g2", the first superconducting circuit 91 and the second superconducting circuit 92 resonate and interact with each other. By the above, operation is repeated in such a manner that, in a case where the initial state is "g1e2", the energy state changes to "ie1g2" (i is the imaginary unit), "−g1e2", "−ie1g2", and the like and returns to "g1e2", and in a case where the initial state is "e1g2", the energy state changes to "ig1e2", "−e1g2", "−ig1e2", and the like and returns to "e1g2". Here, "i", "−", and "−i" mean that the phase is changed by 90°, 180°, and 270°, respectively. Then, after predetermined time elapses from start of irradiation of the control electromagnetic wave, the irradiation of the control electromagnetic wave is stopped, and then the measurement is performed by the measurement unit 97. As a result, the energy state changes from "g1e2" before irradiation to "ie1g2", or from "e1g2" before irradiation to "ig1e2" (see an arrow indicated by a solid line in FIG. 8). This operation is referred to as an iSwap gate because it means exchanging (swapping) two pieces of data. Note that the iSwap gate does not affect a phase difference between the first superconducting circuit 91 and the second superconducting circuit 92. Further, the second quantum gate control electromagnetic wave irradiation unit 96 is not used in the iSwap gate.

Further, as another quantum gate that can be operated by the quantum gate device 90, there is one called a CZ gate. In the CZ gate, "e1e2" is set as an initial state, and further, one of energy states in which one of the first superconducting circuit 91 and the second superconducting circuit 92 is in a second excited state (denoted as "f1" or "f2") and the other is in a ground state is used. Hereinafter, a case where an energy state of "g1f2" in which the first superconducting circuit 91 is in the ground state and the second superconducting circuit 92 is in the second excited state is used will be described as an example. First, the first superconducting circuit 91 is irradiated with a control electromagnetic wave having the frequency $\omega_1$ from the first quantum gate control electromagnetic wave irradiation unit 95, and the second superconducting circuit 92 is irradiated with a control electromagnetic wave having the frequency $\omega_2$ from the second quantum gate control electromagnetic wave irradiation unit 96, so that the energy state is set to the initial state "e1e2". Next, when the first superconducting circuit 91 is irradiated with a control electromagnetic wave having a frequency corresponding to an energy difference $\Delta_{CZ}$ between "g1f2" and "e1e2" from the quantum gate control electromagnetic wave irradiation unit 95, two energy states of "e1e2" and "g1f2" are in a state of resonance. During occurrence of this resonance, the phase is inverted, that is, changed by 180°, every time excitation from "e1e2" to "g1f2" and returning to "e1e2" occurs once. Then, when the control electromagnetic wave is stopped after irradiation with the control electromagnetic wave is performed for predetermined time and phase inversion is generated odd number of times, the phase is inverted from "e1e2" before the irradiation. Such a state in which the phase is inverted is written as "−e1e2". This inverted state can be measured by the measurement unit 97.

CITATION LIST

Non Patent Literature

Non Patent Literature 1: Atsushi Noguchi, and three others, "Single-photon quantum regime of artificial radiation pressure on a surface acoustic wave resonator", [online], Aug. 9, 2018, arXiv, [searched on Apr. 28, 2020], Internet Non Patent Literature 2: Atsushi Noguchi, "Quantum gate with a radiation pressure interaction between superconducting qubits", [online], Apr. 23, 2019, Center for Emergent Matter Science, Institute of Physical and Chemical Research, [searched on Apr. 28, 2020], Internet Non Patent Literature 3: Pranav Mundada, and three others, "Suppression of Qubit Crosstalk in a Tunable Coupling Superconducting Circuit", PHYSICAL REVIEW APPLIED, (USA), American Physical Society, Nov. 11, 2019, Vol. 12, No. 5, pp. 054023-1 to 054023-10

Non Patent Literature 4: Matthew Ware, and five others, "Cross-resonance interactions between superconducting qubits with variable detuning", [online], May 27, 2019, arXiv, [searched on Apr. 28, 2020], Internet

SUMMARY OF INVENTION

Technical Problem

In the above description, a frequency of the control electromagnetic wave is determined based on the value of energy in each energy state obtained without considering an interaction occurring between the first superconducting circuit 91 and the second superconducting circuit 92. However, in practice, there is an extra interaction (See Non Patent Literatures 3 and 4) called a ZZ interaction between the first superconducting circuit 91 and the second superconducting circuit 92. For this reason, the value of energy in each energy state of one superconducting circuit depends on an energy state of the other superconducting circuit. For example, the energy difference between "g1g2" and "e1e2" is $(h/2\pi) \times (\omega_1+\omega_2)$ as described above if the interaction between the first superconducting circuit 91 and the second superconducting circuit 92 is not considered, but actually becomes $(h/2\pi) \times (\omega_1+\omega_2-J)$ due to the ZZ interaction of energy J (FIG. 9). Further, when the second superconducting circuit 92 is in a superposition state of g2 and e2, the energy state of the first superconducting circuit 91 cannot be determined only by g1 and e1, and the first superconducting circuit 91 has two resonance frequencies different from the resonance frequency due to the energy difference between g1 and e1 when there is no ZZ interaction. When such two resonance frequencies exist, operation of a quantum bit cannot be correctly controlled by a control electromagnetic wave having a single frequency, and a phase due to a deviation between the two resonance frequencies occurs.

Further, such a problem caused by the ZZ interaction is not limited to the quantum gate device described in Non Patent Literature 2, and may similarly occur in a quantum gate device obtained by combining two (or more) superconducting circuits including at least one Josephson device in an annular circuit including a superconductor. Examples of such a superconducting circuit include a superconducting circuit having a partial superconducting circuit (corresponding to a configuration in which the second Josephson device group in the partial superconducting circuit described in Non Patent Literature 1 is replaced with only one Josephson device) in which two Josephson devices are annularly connected by a superconducting wire, in which the partial superconducting circuit and a capacitor are annularly connected by a superconducting wire (see FIG. 1 of Non Patent Literature 4).

An object of the present invention is to provide a quantum gate device in which two or more superconducting circuits having a Josephson device are combined, the quantum gate device being capable of suppressing influence of an extra ZZ interaction.

Solution to Problem

A quantum gate device according to the present invention made to solve the above problems includes:
a) a first superconducting circuit including at least one Josephson device in an annular circuit including a superconducting wire, the first superconducting circuit being configured to resonate at a first resonance frequency;
b) a second superconducting circuit including at least one Josephson device in an annular circuit including a superconducting wire, the second superconducting circuit being configured to resonate at a second resonance frequency different from the first resonance frequency;
c) a connection unit including a capacitor and a superconducting wire provided at each of both electrodes of the capacitor, the connection unit being configured to connect the first superconducting circuit and the second superconducting circuit;
d) a magnetic field application means configured to apply a magnetic field to one or both of the first superconducting circuit and the second superconducting circuit;
e) a quantum gate control electromagnetic wave irradiation unit configured to irradiate one of the first superconducting circuit and the second superconducting circuit with a control electromagnetic wave which is an electromagnetic wave having a control frequency corresponding to an original energy difference between two energy states contributing to operation of a quantum gate among a plurality of quantized energy states formed by the first superconducting circuit and the second superconducting circuit; and
f) an unnecessary interaction suppression electromagnetic wave irradiation unit configured to irradiate one of the first superconducting circuit and the second superconducting circuit with an unnecessary interaction suppression electromagnetic wave which is an electromagnetic wave having an unnecessary interaction suppression frequency, the unnecessary interaction suppression frequency being a frequency between a first frequency and a second frequency, and differing by 10 MHz or more from a frequency corresponding to an original energy difference between arbitrarily selected two energy states among a plurality of the energy states, where the first frequency is a frequency corresponding to an original energy difference between a first energy state that is highest and a second energy state that is second highest in three energy states among a plurality of the energy states, and the second frequency is a frequency corresponding to an original energy difference between the second energy state and a third energy state having lowest energy.

The "original energy difference" refers to the energy difference between two energy states in a state where there is no influence by ZZ interaction between the first superconducting circuit and the second superconducting circuit.

In the quantum gate device according to the present invention, operation of a quantum gate is performed by irradiating one of the first superconducting circuit and the second superconducting circuit with a control electromagnetic wave having a control frequency which is a frequency corresponding to an original energy difference between two energy states contributing to the operation of the quantum gate among a plurality of quantized energy states formed by the first superconducting circuit and the second superconducting circuit for predetermined time by using a quantum gate control electromagnetic wave irradiation unit while applying a magnetic field to one or both of the first superconducting circuit and the second superconducting circuit by the magnetic field application means. For example, in a case where the first superconducting circuit and the second superconducting circuit in the quantum gate device according to the present invention are the first superconducting circuit 91 and the second superconducting circuit 92 described in Non Patent Literature 2 described above, the two energy states correspond to "g1e2" and "e1g2", or "e1e2" and "g1f2". In a case of "g1e2" and "e1g2", the quantum gate operates as an iSwap gate or a swap gate to be described later, and in a case of "e1e2" and "g1f2", the quantum gate operates as a CZ gate.

Furthermore, in the quantum gate device according to the present invention, the unnecessary interaction suppression electromagnetic wave irradiation unit irradiates one of the first superconducting circuit and the second superconducting circuit with an unnecessary interaction suppression electromagnetic wave having an unnecessary interaction suppression frequency which is a frequency (however, for a reason described later, a frequency having a difference of less than 10 MHz from the first frequency and the second frequency is not used) between the first frequency which is a frequency corresponding to an original energy difference between the first energy state that is highest and the second energy state having second highest energy in three energy states among a plurality of the energy states and the second frequency which is a frequency corresponding to an original energy difference between the second energy state and the third energy state having lowest energy. For example, in a case where the first superconducting circuit and the second superconducting circuit in the quantum gate device according to the present invention are the first superconducting circuit 91 and the second superconducting circuit 92 described in Non Patent Literature 2 described above, when the first energy state is "g1f2", the second energy state is "e1e2", and the third energy state is "f1g2", the first frequency is the frequency corresponding to an original energy difference between "g1f2" and "e1e2", and the second frequency is the frequency corresponding to an original energy difference between "e1e2" and "f1g2". By irradiation of the unnecessary interaction suppression electromagnetic wave, it is possible to suppress remaining of extra ZZ interaction and to suppress deviation of the three energy states from an original energy value.

When irradiation with an electromagnetic wave having a frequency corresponding to arbitrarily selected two energy states among a plurality of the energy states as an unnecessary interaction suppression electromagnetic wave is performed, undesirable interaction occurs between the two energy states. For this reason, an electromagnetic wave having a frequency close to such a frequency is not used as an unnecessary interaction suppression electromagnetic wave. Normally, in a quantum gate, two energy states having an energy difference corresponding to a frequency of about several hundred MHz to several GHz are used. Therefore, if the unnecessary interaction suppression frequency is different from frequencies corresponding to arbitrarily selected two energy states by 10 MHz or more, undesirable interaction can be prevented. Note that, since "plurality of the energy states" mentioned here also include the first to third energy states, "frequencies corresponding to arbitrarily selected two energy states among a plurality of the energy states" also include the first frequency and the second frequency. Therefore, an electromagnetic wave close to the first frequency and the second frequency (differs from them by less than 10 MHz) is also not used as an unnecessary interaction suppression electromagnetic wave.

Preferably, the unnecessary interaction suppression electromagnetic wave irradiation unit continues irradiation of the unnecessary interaction suppression electromagnetic wave not only while irradiation of the control electromagnetic wave by the quantum gate control electromagnetic wave irradiation unit is performed, but also until operation of a quantum gate ends (an energy state and/or a phase of the first superconducting circuit and the second superconducting circuit are measured) from start of irradiation of the control electromagnetic wave. By the above, it is possible to suppress influence of extra ZZ interaction not only during operation of a quantum gate but also during a period from the end of operation of the quantum gate to output of an operation result.

In the quantum gate device according to the present invention, energy of each of a plurality of the energy states changes according to a difference in output of the unnecessary interaction suppression electromagnetic wave. In view of the above, desirably, output of the unnecessary interaction suppression electromagnetic wave is adjusted so that magnitude of a difference between energy differences of two sets having the same original energy difference among sets of energy states including arbitrarily selected two energy states among a plurality of the energy states is close to zero, specifically, falls within a range of −0.1 MHz to 0.1 MHz. For example, in a case where the first superconducting circuit and the second superconducting circuit in the quantum gate device according to the present invention are the first superconducting circuit 91 and the second superconducting circuit 92 described in Non Patent Literature 2 described above, an original energy difference between "g1e2" and "g1g2" and an original energy difference between "e1e2" and "e1g2" are both $\omega_2$, that is, equal. In view of the above, preferably, by an experiment (in a state where deviation from an original energy difference occurs due to ZZ interaction if there is no irradiation with the unnecessary interaction suppression electromagnetic wave) or calculation in consideration of ZZ interaction, an energy difference between "g1e2" and "g1g2" and an energy difference between "e1e2" and "e1g2" is obtained while output of the unnecessary interaction suppression electromagnetic wave is changed, and output of the unnecessary interaction suppression electromagnetic wave by which a difference between them is in a range of −0.1 MHz to 0.1 MHz is obtained.

As the quantum gate device according to the present invention, the quantum gate device obtained by adding the unnecessary interaction suppression electromagnetic wave irradiation unit to the quantum gate device described in Non Patent Literature 2 can be suitably used. That is, in the quantum gate device according to the present invention, preferably, the first superconducting circuit includes a partial superconducting circuit in which a first Josephson device and a second Josephson device group in which n second Josephson devices having Josephson energy higher than n times Josephson energy of the first Josephson device are connected in series by a wire made from a superconductor, in which the partial superconducting circuit and a capacitor are connected annularly by a wire made from a superconductor, and the second superconducting circuit includes one Josephson device and a capacitor connected annularly by a wire made from a superconductor.

Note, a magnitude relationship between Josephson energy of the Josephson device in the second superconducting circuit and Josephson energy of each of the first and second Josephson devices in the first superconducting circuit does not matter.

As described above, in a case of using the configuration in which the unnecessary interaction suppression electromagnetic wave irradiation unit is added to the quantum gate device described in Non Patent Literature 2, the quantum gate control electromagnetic wave irradiation unit can cause the quantum gate device to operate as an iSwap gate as long as the unnecessary interaction suppression electromagnetic wave irradiation unit irradiates at least the first superconducting circuit with a control electromagnetic wave. On the other hand, in a case where the quantum gate device is operated as a CZ gate and/or a swap gate to be described later, one which irradiates the first superconducting circuit and the second superconducting circuit are with control electromagnetic waves having frequencies different from each other is used as the quantum gate control electromagnetic wave irradiation unit.

Advantageous Effects of Invention

According to the present invention, in a quantum gate device in which two or more superconducting circuits having a Josephson device are combined, influence of extra ZZ interaction can be suppressed.

DESCRIPTION OF EMBODIMENTS

An embodiment of a quantum gate device according to the present invention will be described with reference to FIGS. 1 to 6.

(1) Configuration of Quantum Gate Device of Present Embodiment

Figure 1:
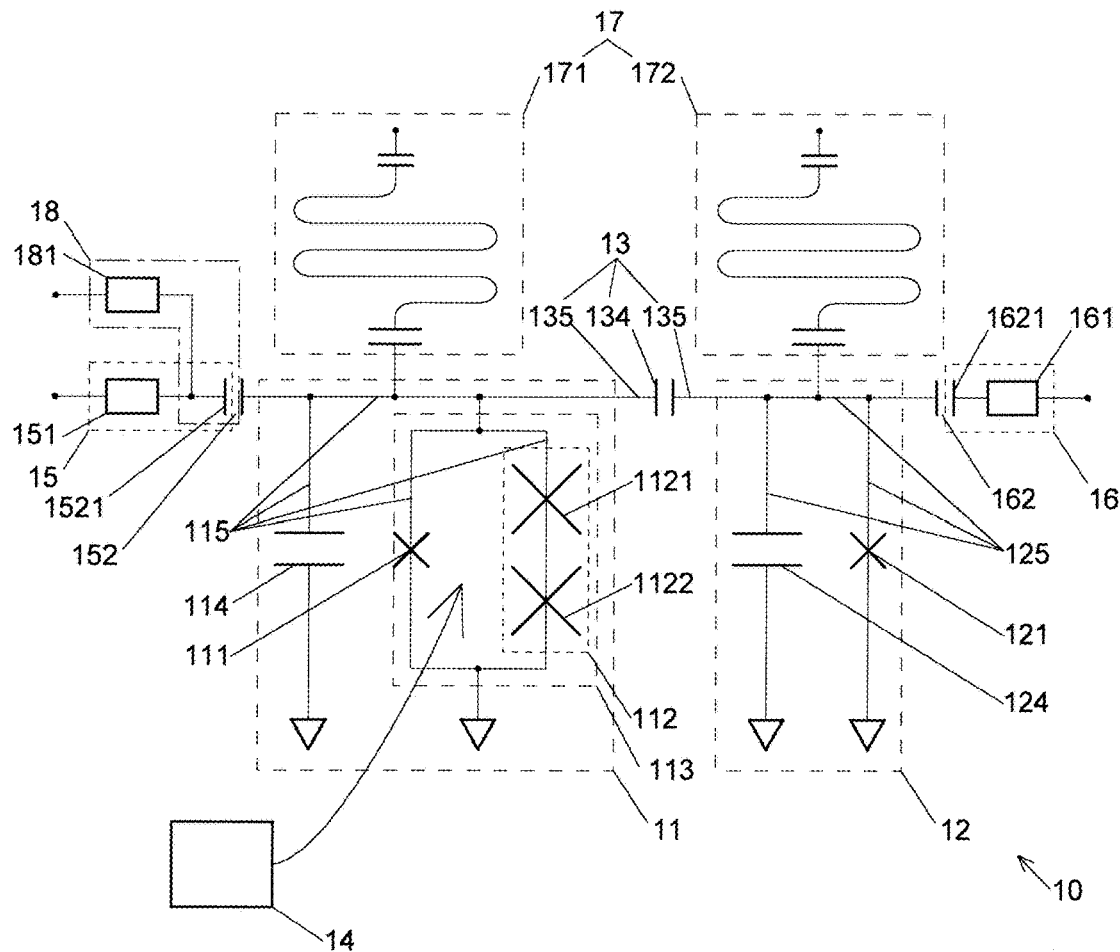
FIG. 1 is a schematic diagram illustrating an embodiment of a quantum gate device according to the present invention.

FIG. 1 is a diagram illustrating an outline of a configuration of a quantum gate device 10 of the present embodiment by an equivalent circuit. The quantum gate device 10 includes a first superconducting circuit 11, a second superconducting circuit 12, a connection unit 13, a magnetic field application unit 14, a quantum gate control electromagnetic wave irradiation unit (a first quantum gate control electromagnetic wave irradiation unit 15 and a second quantum gate control electromagnetic wave irradiation unit 16), a measurement unit 17, and an unnecessary interaction suppression electromagnetic wave irradiation unit 18.

Figure 2A:
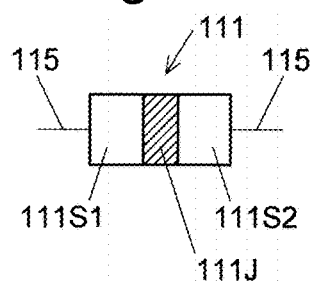
FIG. 2A is a diagram illustrating a first Josephson device included in the quantum gate device of the present embodiment.
Figure 2B:
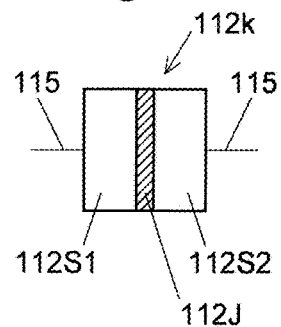
FIG. 2B is a diagram illustrating a second Josephson device included in the quantum gate device of the present embodiment.

The first superconducting circuit 11 includes a first Josephson device 111, a second Josephson device group 112, and a first capacitor 114. The first Josephson device 111 is formed by sandwiching a joint portion having a first thin film 111J formed of an insulator between two superconductors 111S1 and 111S2 (FIG. 2A). In the second Josephson device group 112, n (n is an integer of two or more) second Josephson devices 1121, 1122, . . . , 112n are connected in series by a wiring 115 including a superconductor. Note that, although a case where n=2 is illustrated as an example in FIG. 1, n may be an integer of three or more. Each second Josephson device 112k (k is an integer in a range of 1 to n) is obtained by sandwiching a second thin film 112J made of the same type of insulator as the first thin film 111J between two superconductors 112S1 and 112S2 (FIG. 2B). Here, thickness and areas of the first thin film 111J and the second thin film 112J are set so that a value of tunnel resistance in the first Josephson device 111 is larger than n times a value of tunnel resistance in each of the second Josephson devices 112k. In this manner, Josephson energy of each of the second Josephson devices 112k is larger than n times Josephson energy of the first Josephson device 111.

The first Josephson device 111 and the second Josephson device group 112 are annularly connected by the superconducting wire 115, by which a partial superconducting circuit 113 is formed. Furthermore, the partial superconducting circuit 113 and the first capacitor 114 are connected in parallel by the superconducting wire 115.

The first superconducting circuit 11 configured as described above is a circuit equivalent to an LC resonance circuit. A resonance frequency of the first superconducting circuit 11 is set to $\omega_1$.

The second superconducting circuit 12 is a transmon in which one Josephson device 121 and one second capacitor 124 are annularly connected by a superconducting wire 125. The second superconducting circuit 12 is also a circuit equivalent to an LC resonance circuit. A resonance frequency of the second superconducting circuit 12 is set to $\omega_2$.

The connection unit 13 includes a connection unit capacitor 134 and superconducting wires 135 provided on both electrodes of the connection unit capacitor 134. The first superconducting circuit 11 and the second superconducting circuit 12 are connected by the connection unit 13.

The magnetic field application unit 14 applies a static magnetic field to the inside of the partial superconducting circuit 113. Magnitude of the static magnetic field to be applied is not particularly limited as long as the static magnetic field is smaller than a magnetic field that destroys a superconducting state of the superconductors 111S1, 111S2, 112S1, and 112S2 of the first Josephson device 111 and the second Josephson devices 112k and the superconductor of the superconducting wire 115, but is preferably smaller. For example, the intensity is desirably one by which a magnetic flux of five times or less a magnetic flux quantum is generated in the partial superconducting circuit 113, and the intensity is more desirably one by which a magnetic flux of one time or less a magnetic flux quantum is generated in the partial superconducting circuit 113. A preferable magnitude of a static magnetic field is, for example, about 10 μT.

The first quantum gate control electromagnetic wave irradiation unit 15 includes a quantum gate control power supply 151 and an electromagnetic wave irradiation electrode 1521. The electromagnetic wave irradiation electrode 1521 is represented as one electrode of a capacitor 152 connected to the first superconducting circuit 11 in the equivalent circuit illustrated in FIG. 1. The quantum gate control power supply 151 applies radio-frequency voltage having a predetermined frequency (control frequency) used for operation as a quantum gate between the electromagnetic wave irradiation electrode 1521 and the ground to irradiate the first superconducting circuit 11 with a control electromagnetic wave having the control frequency.

The second quantum gate control electromagnetic wave irradiation unit 16 includes a quantum gate control power supply 161 and an electromagnetic wave irradiation electrode 1621, similarly to the first quantum gate control electromagnetic wave irradiation unit 15. The electromagnetic wave irradiation electrode 1621 is represented as one electrode of a capacitor 162 connected to the second superconducting circuit 12 in the equivalent circuit illustrated in FIG. 1. The quantum gate control power supply 161 applies radio-frequency voltage having a predetermined control frequency (different from a control frequency in the first quantum gate control electromagnetic wave irradiation unit 15) between the electromagnetic wave irradiation electrode 1621 and the ground to irradiate the second superconducting circuit 12 with a control electromagnetic wave having the control frequency.

The unnecessary interaction suppression electromagnetic wave irradiation unit 18 includes an unnecessary interaction suppression electromagnetic wave power supply 181 and the electromagnetic wave irradiation electrode 1521. The electromagnetic wave irradiation electrode 1521 is shared by the first quantum gate control electromagnetic wave irradiation unit 15 and the unnecessary interaction suppression electromagnetic wave irradiation unit 18. The unnecessary interaction suppression electromagnetic wave power supply 181 applies radio-frequency voltage having a predetermined frequency (unnecessary interaction suppression frequency) different from the control frequency between the electromagnetic wave irradiation electrode 1521 and the ground to irradiate the first superconducting circuit 11 with an unnecessary interaction suppression electromagnetic wave having the unnecessary interaction suppression frequency. Note that the quantum gate control power supply 151 and the unnecessary interaction suppression electromagnetic wave power supply 181 can be shared when mounted by employing a power supply capable of simultaneously generating a plurality of frequencies.

Details of the control frequency and the unnecessary interaction suppression frequency will be described later together with description of operation of the quantum gate device 10.

The measurement unit 17 includes a first measurement unit 171 which measures an energy state and a phase of the first superconducting circuit 11 and a second measurement unit 172 which measures an energy state and a phase of the second superconducting circuit 12.

Figure 3:
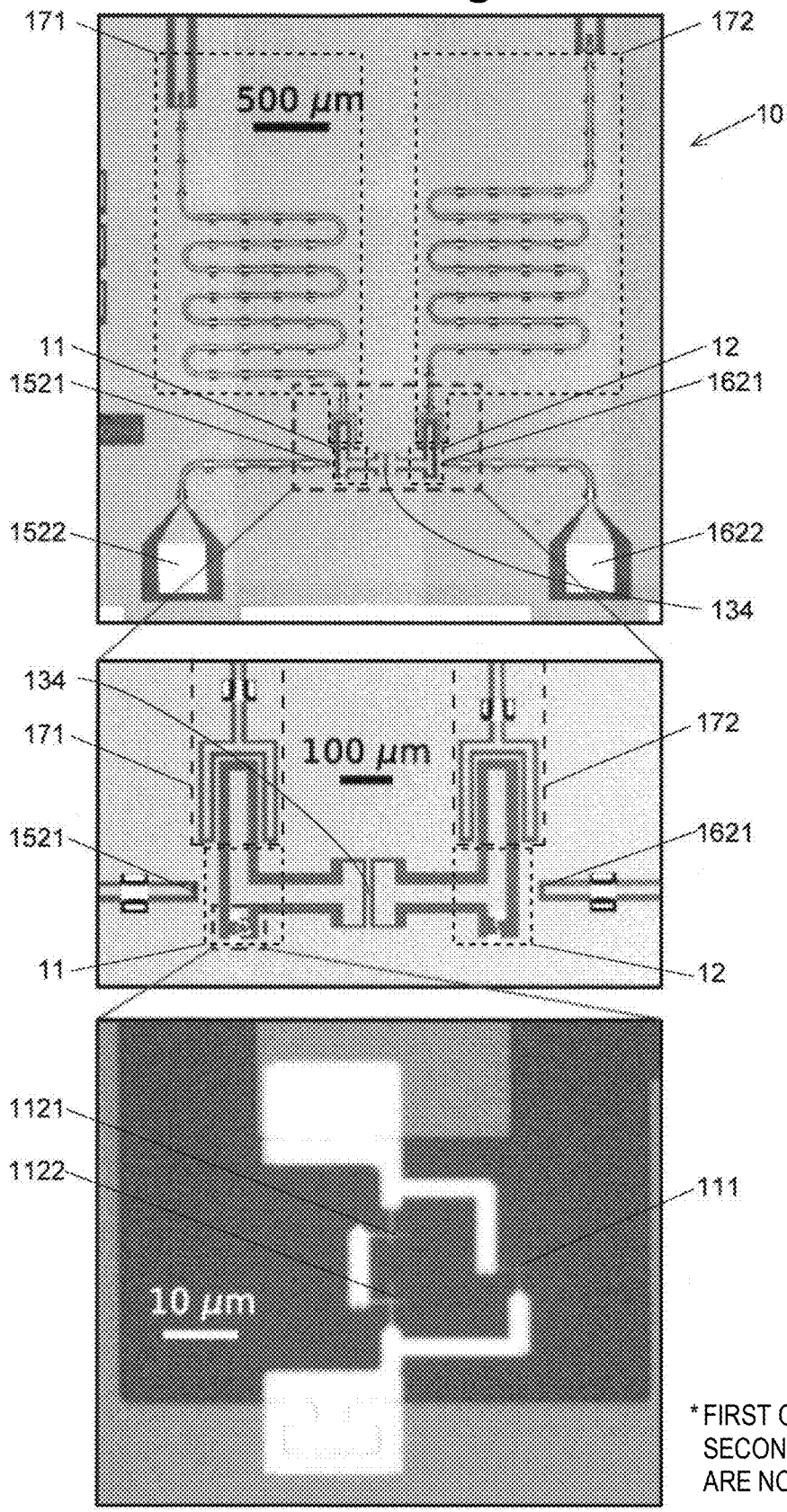
FIG. 3 is a photomicrograph showing an example of manufacturing the quantum gate device of the present embodiment (upper photomicrograph), a photomicrograph obtained by enlarging and photographing a part of a region photographed in the upper photomicrograph (middle photomicrograph), and a photomicrograph obtained by enlarging and photographing a part of a region photographed in the middle photomicrograph (lower photomicrograph).

FIG. 3 illustrates a photomicrograph of the quantum gate device 10 which is actually produced. In FIG. 3, a photomicrograph of the entire quantum gate device 10 is illustrated in the upper part, a photomicrograph of a part of the photomicrograph enlarged and photographed is illustrated in the middle part, and, further, a photomicrograph of a part of the photomicrograph enlarged and photographed is illustrated in the lower part. In FIG. 3, a portion enclosed by a gray line darker than light gray in the background is a portion where a surface of a substrate made from silicon appears, a light gray portion is made from niobium, and a white portion is made from aluminum. Niobium and aluminum are superconductors. Although not illustrated in this photomicrograph, alumina obtained by oxidizing aluminum is used for a thin film made from an insulator of each of Josephson devices. Note that, in the present invention, the superconductor and the insulator are not limited to these examples, and any material can be used.

FIG. 3 does not illustrate the quantum gate control power supply 151 or the unnecessary interaction suppression electromagnetic wave power supply 181, but illustrates an electrode 1522 to which the two power supplies are connected in common. Similarly, FIG. 3 does not illustrate the quantum gate control power supply 161, but illustrates an electrode 1622 to which the power supply is connected. Further, in FIG. 3, the first capacitor 114 and the second capacitor 124 are not denoted by reference numerals, but the first capacitor 114 is formed between the superconducting wire 115 and the ground, and the second capacitor 124 is formed between the superconducting wire 125 and the ground.

(2) Operation of Quantum Gate Device of Present Embodiment

Hereinafter, operation of the quantum gate device of the present embodiment will be described.

(2-1) Energy State which May be Taken by Quantum Gate Device 10

Figure 4:
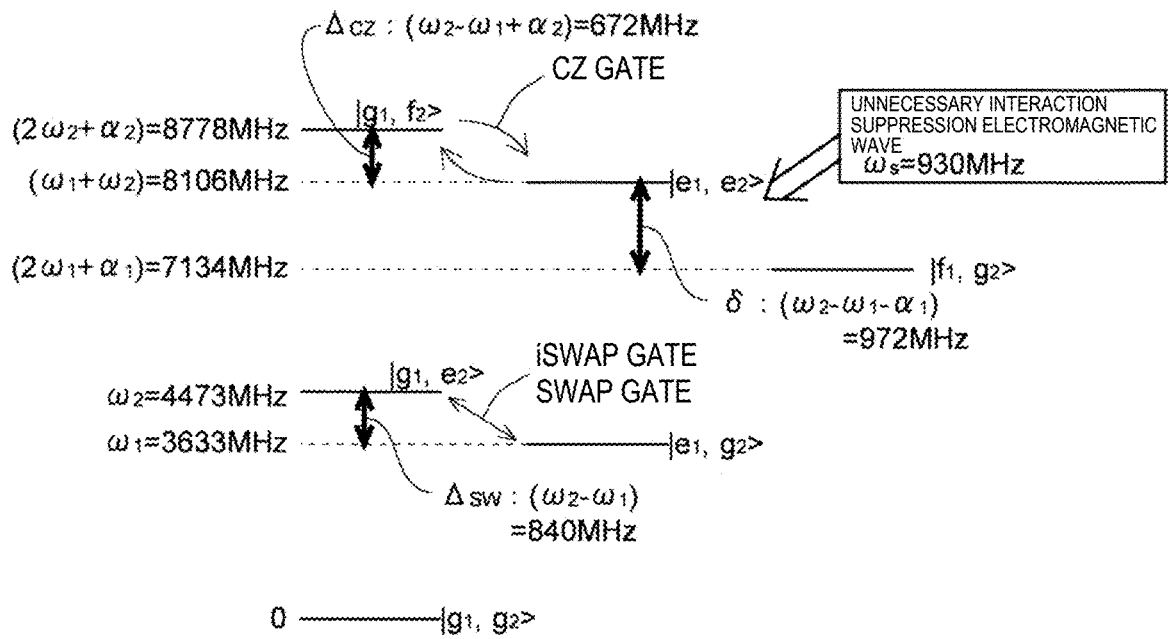
FIG. 4 is a diagram for explaining an energy state that may be taken by the quantum gate device of the present embodiment, operation of three quantum gates (swap gate, iSwap gate, and CZ gate), and irradiation of an unnecessary interaction suppression electromagnetic wave.

The quantum gate device 10 is cooled to the superconducting transition temperature or less by a cooling device, and a static magnetic field is applied from the magnetic field application unit 14 into the partial superconducting circuit 113. After that, the quantum gate device 10 takes one of a plurality of energy states illustrated in FIG. 4 by irradiation with a control electromagnetic wave having a predetermined control frequency described later from the quantum gate control electromagnetic wave irradiation unit 15 for a predetermined time. FIG. 4 illustrates six energy states of "g1g2", "e1g2", "g1e2", "f1g2", "e1e2", and "g1f2" in which one of a ground state "g1", a first excited state "e1", and a second excited state "f1", which are energy states of the first superconducting circuit 11, and one of a ground state "g2", a first excited state "e2", and a second excited state "f2", which are energy states of the second superconducting circuit 12, are combined.

In addition, in FIG. 4, original energy (in a state in which there is no influence of a ZZ interaction) in each of the six energy states obtained by experiment in the quantum gate device 10 illustrated in FIG. 3 is illustrated in units of frequency with "g1g2" as a reference (value zero). Values of frequencies below are multiplied by $(h/2\pi)$ to obtain an energy value. Values of these frequencies are 3633 MHz $(=\omega_1)$ for "e1g2", 4473 MHz $(=\omega_2)$ for "g1e2", 7134 MHz $(=2\omega_1+\alpha_1$ ($\alpha_1$ will be described later)) for "f1g2", 8106 MHz $(=\omega_1+\omega_2)$ for "e1e2", and 8778 MHz $(=2\omega_2+\alpha_2$ ($\alpha_2$ will be described later)) for "g1f2". In the example illustrated in FIG. 4, since $\omega_1$ is smaller than $\omega_2$, "e1g2" is smaller than "g1e2", and "f1g2" is smaller than "g1f2". An original difference $\Delta_{SW}$ $(=\omega_2-\omega_1)$ between "g1e2" and "e1g2" is 840 MHz, an original difference $\Delta_{CZ}(=\omega_2-\omega_1+\alpha_2)$ between "g1f2" and "e1e2" is 672 MHz, and an original difference $\delta$ $(=\omega_2-\omega_1-\alpha_1)$ between "e1e2" and "f1g2" is 972 MHz. The value $\alpha_1$ is defined by a difference between an energy interval between the f1 state and the e1 state and an energy interval between the e1 state and the g1 state for the energy states g1, e1, and f1 in a case where the first superconducting circuit 11 exists alone. Similarly, $\alpha_2$ is defined by a difference between an energy interval between the f2 state and the e2 state and an energy interval between the e2 state and the g2 state for the energy states g2, e2, and f2 in a case where the second superconducting circuit 12 exists alone. The value $\alpha_1$ is −132 MHz, and $\alpha_2$ is −168 MHz.

In the quantum gate device 10 being in such an energy state, suppression of unnecessary interaction in a case where the quantum gate device 10 is operated as one of the three quantum gates, which are an iSwap gate, a CZ gate, and a swap gate, by operation described below will be described. Hereinafter, the initial state is assumed to be "g1g2".

(2-2) Operation of Each Quantum Gate and Suppression of Unnecessary Interaction
(2-2-1) iSwap Gate First, the unnecessary interaction suppression electromagnetic wave irradiation unit 18 irradiates the first superconducting circuit 11 with an unnecessary interaction suppression electromagnetic wave having an unnecessary interaction suppression frequency. In the present embodiment, a focus is placed on three energy states of "g1f2", "e1e2", and "f1g2". Then, 930 MHz, which is a frequency between $\Delta_{CZ}$=672 MHz, which is a frequency (the first frequency) corresponding to an original energy difference between "g1f2" (the first energy state) and "e1e2" (the second energy state) having highest energy among the three energy states, and $\delta$=972 MHz, which is a frequency (the second frequency) corresponding to an original energy difference between "e1e2" and "f1g2" (the third energy state), and is a frequency different by 10 MHz or more from any of original energy differences (for example, $\Delta_{SW}$=840 MHz)

between any two energy states including the three energy states, is set as the unnecessary interaction suppression frequency.

Next, the first superconducting circuit 11 is irradiated with a control electromagnetic wave having the frequency $\omega_1$, which is the original control frequency, in a manner superimposed on the unnecessary interaction suppression electromagnetic wave by the first quantum gate control electromagnetic wave irradiation unit 15, so that the energy state is set to "e1g2". Subsequently, the first superconducting circuit 11 is irradiated with a control electromagnetic wave having a frequency (($\omega_2-\omega_1$), 840 MHz in the example of FIG. 4) corresponding to $\Delta_{SW}$, which is the original control frequency, in a manner superimposed on the unnecessary interaction suppression electromagnetic wave by the first quantum gate control electromagnetic wave irradiation unit 15. In this manner, the first superconducting circuit 11 and the second superconducting circuit 12 resonate and interact with each other, and operation in which the energy state changes from "g1e2" to "ie1g2", "–g1e2", "–ie1g2", and returning to "g1e2" is repeated. Here, "i", "–", and "–i" mean that the phase is changed by 90°, 180°, and 270°, respectively. Then, the irradiation of the control electromagnetic wave is stopped after predetermined time elapses from the start of the irradiation of the control electromagnetic wave. After the above, when measurement is performed by the measurement unit 17, the energy state changes from "g1e2" before irradiation to "ie1g2".

Alternatively, when the first superconducting circuit 11 is irradiated for predetermined time with a control electromagnetic wave having a frequency corresponding to $\Delta_{SW}$ which is the original control frequency in a manner superimposed on the unnecessary interaction suppression electromagnetic wave by the first quantum gate control electromagnetic wave irradiation unit 15 from the state where the energy state is "g1e2", an energy state measured by the measurement unit 17 changes from "e1g2" before irradiation to "ig1e2".

As described above, operation in which the energy state changes from "g1e2" to "ie1g2" or from "e1g2" to "ig1e2", that is, two pieces of data are exchanged (swapped) is performed.

By irradiation of the first superconducting circuit 11 with the unnecessary interaction suppression electromagnetic wave continuously over the entire operation of the iSwap gate, influence of extra ZZ interaction can be suppressed. For this reason, it is possible to prevent an unnecessary phase from being applied when a control electromagnetic wave having the original control frequency is irradiated.

(2-2-2) CZ Gate

First, as in the case of the iSwap gate, the unnecessary interaction suppression electromagnetic wave irradiation unit 18 irradiates the first superconducting circuit 11 with an unnecessary interaction suppression electromagnetic wave having a frequency $\omega_s$. The irradiation of the unnecessary interaction suppression electromagnetic wave is continuously performed over the entire operation of the CZ gate described below.

Next, the first superconducting circuit 11 is irradiated with a control electromagnetic wave having the frequency $\omega_1$ in a manner superimposed on the unnecessary interaction suppression electromagnetic wave by the first quantum gate control electromagnetic wave irradiation unit 15 and the second superconducting circuit 12 is irradiated with a control electromagnetic wave having the frequency $\omega_2$ by the second quantum gate control electromagnetic wave irradiation unit 16, so that the energy state is set to "e1e2". Subsequently, the first superconducting circuit 11 is irradiated with a control electromagnetic wave having a frequency (($\omega_2-\omega_1+\alpha_2$), 672 MHz in the example of FIG. 4) corresponding to the original energy difference $\Delta_{CZ}$ between "g1e2" and "e1g2" in a manner superimposed on the unnecessary interaction suppression electromagnetic wave by the first quantum gate control electromagnetic wave irradiation unit 15. By the above, the first superconducting circuit 11 and the second superconducting circuit 12 resonate and interact with each other, and the energy state alternately takes two states of "e1e2" and "g1f2". Further, the phase is inverted, that is, changed by 180° every time excitation from "e1e2" to "g1f2" and returning to "e1e2" occurs once. Then, the irradiation of the control electromagnetic wave is stopped after predetermined time elapses from the start of the irradiation of the control electromagnetic wave. After the above, when measurement is performed by the measurement unit 17, the states of the first superconducting circuit 11 and the second superconducting circuit 12 measured by the measurement unit 17 change from "e1e2" before irradiation to "–e1e2". This means that the energy state does not change before and after the irradiation of the control electromagnetic wave, and the phase is changed by 180°.

Also in the CZ gate, by irradiation of the first superconducting circuit 11 with the unnecessary interaction suppression electromagnetic wave continuously over the entire operation, influence of extra ZZ interaction can be suppressed.

(2-2-3) Swap Gate

A swap gate refers to operation of a quantum gate that changes the energy state from "g1e2" to "e1g2" or from "e1g2" to "g1e2".

First, as in the case of the iSwap gate and the CZ gate, the unnecessary interaction suppression electromagnetic wave irradiation unit 18 irradiates the first superconducting circuit 11 with an unnecessary interaction suppression electromagnetic wave having the frequency $\omega_s$. The irradiation of the unnecessary interaction suppression electromagnetic wave is continuously performed over the entire operation of the swap gate described below.

Next, the first superconducting circuit 11 is irradiated with a control electromagnetic wave having the frequency $\omega_1$, which is the original control frequency, for predetermined time by the first quantum gate control electromagnetic wave irradiation unit 15, so that the energy state is set to a quantum superposition state of "g1g2" and "e1g2". Alternatively, the second superconducting circuit 12 may be irradiated with a control electromagnetic wave having the frequency $\omega_2$, which is the original control frequency, for predetermined time by the second quantum gate control electromagnetic wave irradiation unit 16, so that the energy state is set to a quantum superposition state of "e1g2" and "e1e2". In such a quantum superposition state, the first superconducting circuit 11 is simultaneously irradiated with an electromagnetic wave of a frequency ($\omega_2-\omega_1$) and an electromagnetic wave of a frequency ($\omega_2-\omega_1+\alpha_2$) by the first quantum gate control electromagnetic wave irradiation unit 15. By the above, the first superconducting circuit 11 and the second superconducting circuit 12 resonate and interact with each other, the energy state changes between "g1e2" and "e1g2", and the circuits operate as a swap gate.

Also in the swap gate, by irradiation of the first superconducting circuit 11 with the unnecessary interaction suppression electromagnetic wave continuously over the entire operation, influence of extra ZZ interaction can be suppressed.

(2-3) Output of Unnecessary Interaction Suppression Electromagnetic Wave

Figure 5:
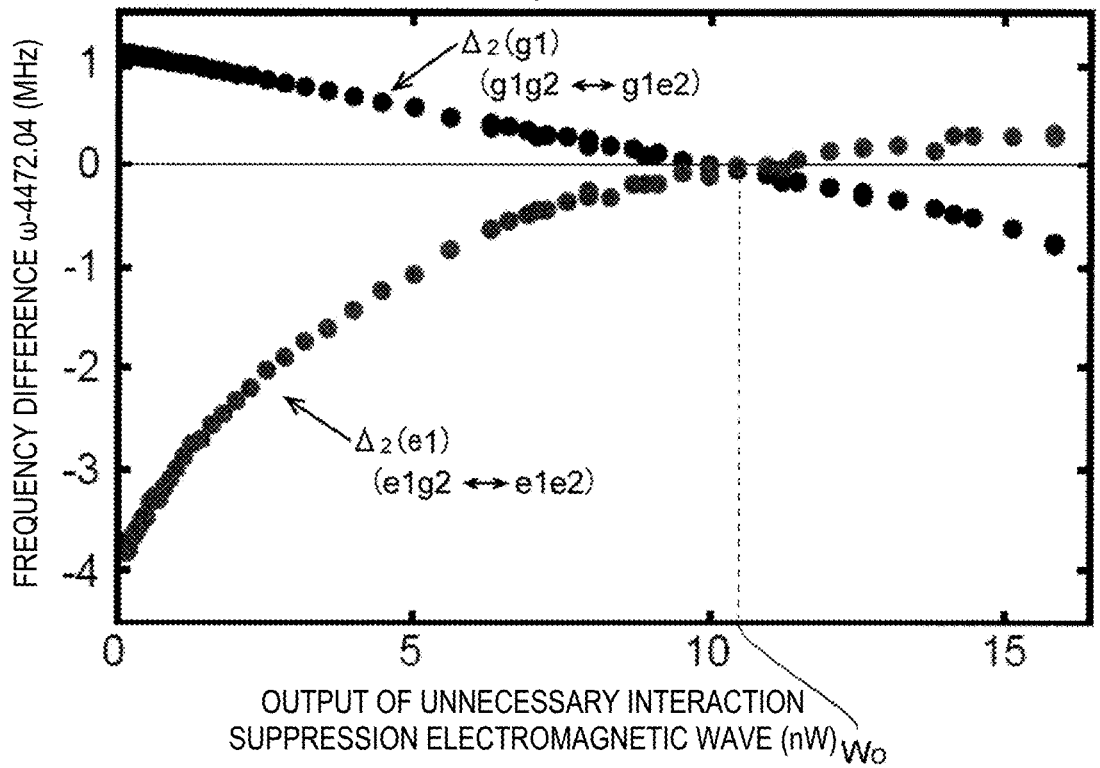
FIG. 5 is a graph illustrating a result of an experiment of measuring an energy difference Δ2(g1) between "g1e2" and "g1g2" and an energy difference Δ2(e1) between "e1e2" and "e1g2" while changing output of an unnecessary interaction suppression electromagnetic wave in the quantum gate device of the present embodiment.

As described above, lowering in energy of "e1e2" can be suppressed by irradiation of the unnecessary interaction suppression electromagnetic wave, but degree of the suppression depends on output of the unnecessary interaction suppression electromagnetic wave. In order to check this, an experiment of measuring an energy difference between "g1e2" and "g1g2" (referred to as $\Delta_2(g1)$) and an energy difference between "e1e2" and "e1g2" (referred to as $\Delta_2(e1)$) while changing output of the unnecessary interaction suppression electromagnetic wave was conducted. FIG. 5 shows a measurement result.

When irradiation with the unnecessary interaction suppression electromagnetic wave is not performed, that is, when a value of output of the unnecessary interaction suppression electromagnetic wave on the horizontal axis in FIG. 5 is zero, $\Delta_2(g1)$ and $\Delta_2(e1)$ are both $(h/2\pi)\omega_2$ if there is no ZZ interaction, but $\Delta_2(e1)$ is actually smaller than $\Delta_2(g1)$. This is because energy of "e1e2" is lowered due to presence of ZZ interaction. When output of the unnecessary interaction suppression electromagnetic wave is increased from this state, a difference between $\Delta_2(g1)$ and $\Delta_2(e1)$ decreases. Then, when the output is $W_O$ (see FIG. 5), $\Delta_2(g1)$ and $\Delta_2(e1)$ are equal. Then, when the output of the unnecessary interaction suppression electromagnetic wave is further increased, $\Delta_2(e1)$ becomes larger than $\Delta_2(g1)$.

When the quantum gate device 10 is operated, it is desirable to adjust the output of the unnecessary interaction suppression electromagnetic wave so that the difference between $\Delta_2(g1)$ and $\Delta_2(e1)$ becomes as small as possible. For example, the output of the unnecessary interaction suppression electromagnetic wave is adjusted such that $\Delta_2(g1)-\Delta_2(e1)$ is $-0.1$ MHz to $+0.1$ MHz.

Similarly to the intensity of the unnecessary interaction suppression electromagnetic wave, it is desirable to adjust the frequency $\omega s$ of the unnecessary interaction suppression electromagnetic wave so that the difference between $\Delta_2(g1)$ and $\Delta_2(e1)$ is as small as possible (for example, $\Delta_2(g1)-\Delta_2(e1)$ is between $-0.1$ MHz and $+0.1$ MHz.). Further, it is more desirable to minimize the difference between $\Delta_2(g1)$ and $\Delta_2(e1)$ while minimizing the intensity of the unnecessary interaction suppression electromagnetic wave by adjusting both the intensity and the frequency $\omega s$ of the unnecessary interaction suppression electromagnetic wave.

(3) Variation

The present invention is not limited to the above embodiment, and various variations are possible.

For example, in the above embodiment, irradiation with the control electromagnetic wave for setting the energy state to a predetermined initial state is performed before irradiation with the control electromagnetic wave for operating as the quantum gate (iSwap gate, CZ gate, or swap gate) is performed, but the irradiation of the control electromagnetic wave for setting the energy state to the predetermined initial state is not essential, and irradiation with the control electromagnetic wave for operating as the quantum gate may be performed from an arbitrarily selected initial state. Further, the second quantum gate control electromagnetic wave irradiation unit 16 may be omitted in a case where the irradiation with the control electromagnetic wave for setting the predetermined initial state is not performed, or in a case where the quantum gate device 10 is operated only as the iSwap gate even in a case where such irradiation with the control electromagnetic wave is performed.

Figure 6:
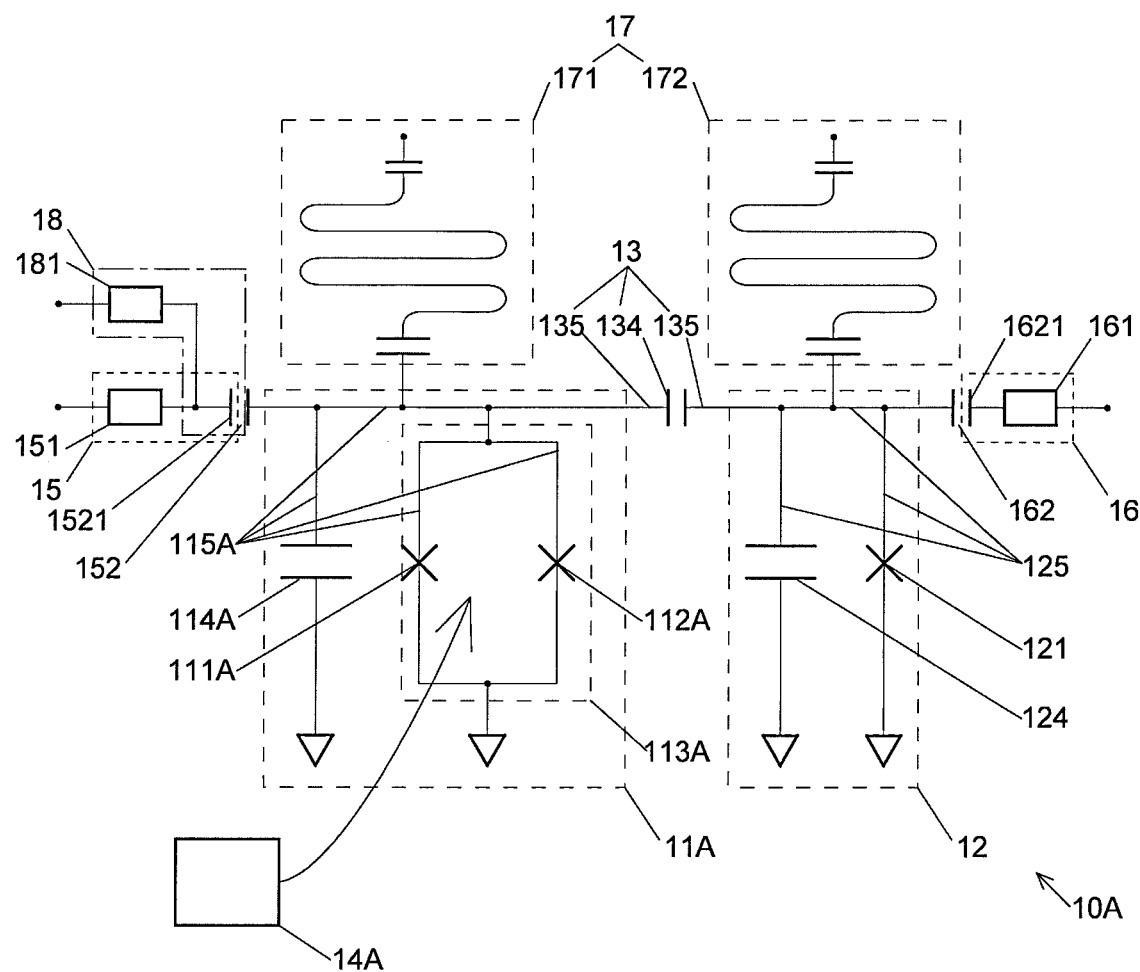
FIG. 6 is a schematic diagram illustrating a variation of the quantum gate device according to the present invention.
Figure 7:
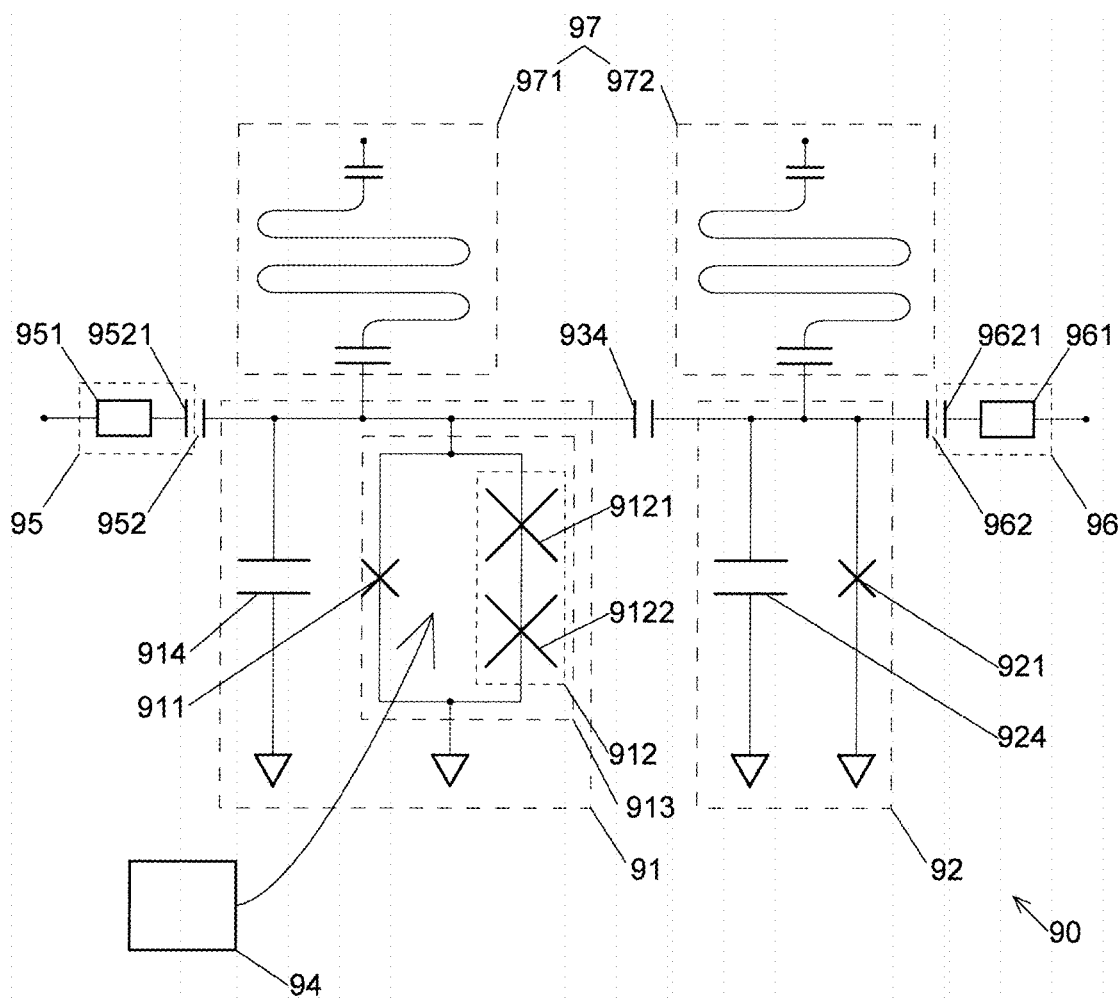
FIG. 7 is a schematic diagram illustrating an example of a conventional quantum gate device.
Figure 8:
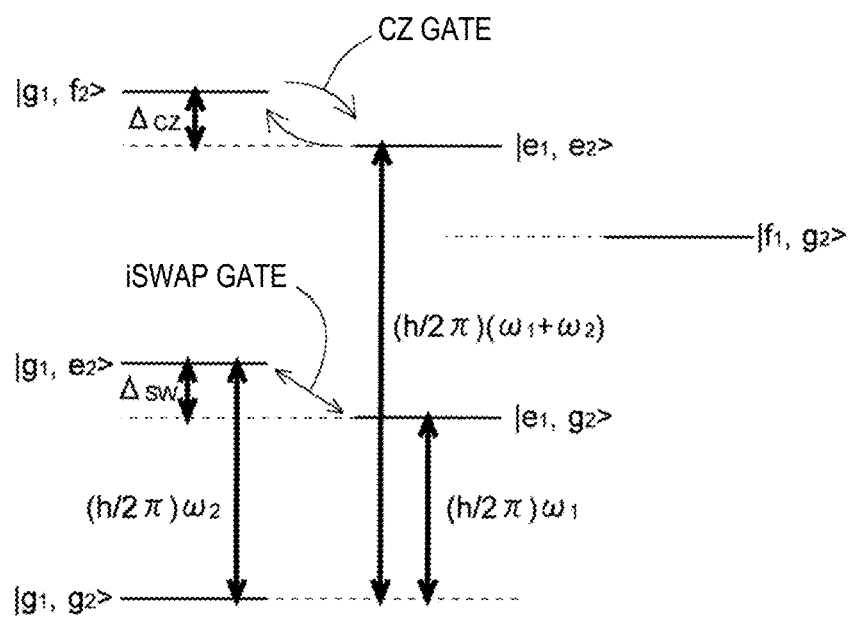
FIG. 8 is a diagram illustrating an example of operation of a swap gate and a CZ gate in a conventional quantum gate device.
Figure 9:
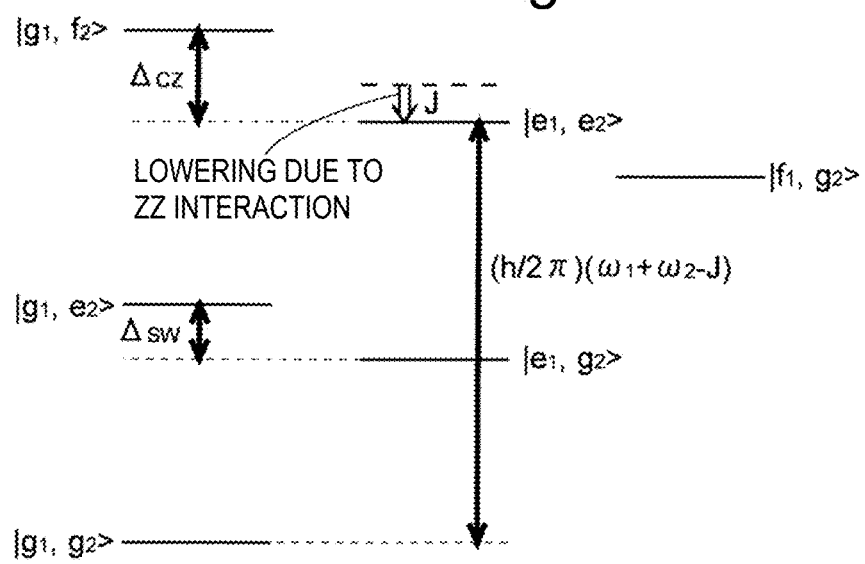
FIG. 9 is a diagram illustrating an energy state in consideration of a ZZ interaction in a conventional quantum gate device.

The configurations of the first superconducting circuit 11 and the second superconducting circuit 12 are also not limited to those described above. FIG. 6 illustrates a quantum gate device 10A using, instead of the first superconducting circuit 11, a first superconducting circuit 11A in which a partial superconducting circuit 113A in which two Josephson devices (first and second Josephson devices 111A and 112A) are annularly connected by a superconducting wire 115A and a first capacitor 114A are connected in parallel by the superconducting wire 115A. The first and second Josephson devices 111A and 112A may have different and identical Josephson energy. Further, in this variation, a magnetic field application unit 14A applies an AC magnetic field to the inside of the partial superconducting circuit 113A. The quantum gate device 10A corresponds to a configuration obtained by adding the unnecessary interaction suppression electromagnetic wave irradiation unit 18 to the configuration shown in Non Patent Literature 4.

REFERENCE SIGNS LIST 10, 10A, 90 . . . Quantum Gate Device
11, 91 . . . First Superconducting Circuit
111, 111A, 911 . . . First Josephson Device
111J . . . First Thin Film
112, 912 . . . Second Josephson Device Group
1121, 1122, 112$k$, 112A, 9121, 9122 . . . Second Josephson Device
112J . . . Second Thin Film
113, 113A, 913 . . . Partial Superconducting Circuit
114, 114A . . . First Capacitor
115, 115A, 125, 135 . . . Superconducting Wire
12, 92 . . . Second Superconducting Circuit
121, 921 . . . Josephson Device
124 . . . Second Capacitor
13 . . . Connection Unit
134 . . . Connection Unit Capacitor
14, 94 . . . Magnetic Field Application Unit
15, 95 . . . First Quantum Gate Control Electromagnetic Wave Irradiation Unit
151, 161 . . . Quantum Gate Control Power Supply
152, 162, 952 . . . Capacitor
1521, 1621, 9521 . . . Electromagnetic Wave Irradiation Electrode
1522, 1622 . . . Electrode
16, 96 . . . Second Quantum Gate Control Electromagnetic Wave Irradiation Unit
17, 97 . . . Measurement Unit
171, 971 . . . First Measurement Unit
172, 972 . . . Second Measurement Unit
18 . . . Unnecessary Interaction Suppression Electromagnetic Wave Irradiation Unit
181 . . . Unnecessary Interaction Suppression Electromagnetic Wave Irradiation Power Supply
951, 961 . . . Radio-Frequency Power Supply

The invention claimed is:

1. A quantum gate device comprising:
a) a first superconducting circuit including at least one Josephson device in an annular circuit including a superconducting wire, the first superconducting circuit being configured to resonate at a first resonance frequency;
b) a second superconducting circuit including at least one Josephson device in an annular circuit including a superconducting wire, the second superconducting circuit being configured to resonate at a second resonance frequency different from the first resonance frequency;

c) a connection unit including a capacitor and a superconducting wire provided at each of both electrodes of the capacitor, the connection unit being configured to connect the first superconducting circuit and the second superconducting circuit;

d) a magnetic field application means configured to apply a magnetic field to one or both of the first superconducting circuit and the second superconducting circuit;

e) a quantum gate control electromagnetic wave irradiation unit configured to irradiate one of the first superconducting circuit and the second superconducting circuit with a control electromagnetic wave which is an electromagnetic wave having a control frequency corresponding to an original energy difference between two energy states contributing to operation of a quantum gate among a plurality of quantized energy states formed by the first superconducting circuit and the second superconducting circuit; and f) an unnecessary interaction suppression electromagnetic wave irradiation unit configured to irradiate one of the first superconducting circuit and the second superconducting circuit with an unnecessary interaction suppression electromagnetic wave which is an electromagnetic wave having an unnecessary interaction suppression frequency, the unnecessary interaction suppression frequency being a frequency between a first frequency and a second frequency, and differing by 10 MHz or more from a frequency corresponding to an original energy difference between arbitrarily selected two energy states among a plurality of the energy states, where the first frequency is a frequency corresponding to an original energy difference between a first energy state that is highest and a second energy state that is second highest in three energy states among a plurality of the energy states, and the second frequency is a frequency corresponding to an original energy difference between the second energy state and a third energy state having lowest energy.

2. The quantum gate device according to claim 1, wherein the unnecessary interaction suppression electromagnetic wave irradiation unit is configured to continue irradiation with the unnecessary interaction suppression electromagnetic wave from start of irradiation with the control electromagnetic wave by the quantum gate control electromagnetic wave irradiation unit to end of operation of a quantum gate.

3. The quantum gate device according to claim 1, wherein output of the unnecessary interaction suppression electromagnetic wave is adjusted so that magnitude of a difference between energy differences of two sets having a same original energy difference among sets of energy states including arbitrarily selected two energy states among the plurality of energy states falls within a range of −0.1 MHz to 0.1 MHz.

4. The quantum gate device according to claim 1, wherein the first superconducting circuit includes a partial superconducting circuit in which a first Josephson device and a second Josephson device group in which n second Josephson devices having Josephson energy higher than n times Josephson energy of the first Josephson device are connected in series by a wire made from a superconductor, in which the partial superconducting circuit and a capacitor are connected annularly by a wire made from a superconductor, and the second superconducting circuit includes one Josephson device and a capacitor connected annularly by a wire made from a superconductor.

5. A quantum computer comprising the quantum gate device according to claim 1.

6. A quantum computer comprising the quantum gate device according to claim 2.

7. A quantum computer comprising the quantum gate device according to claim 3.

8. A quantum computer comprising the quantum gate device according to claim 4.

* * * * *